(12) United States Patent
Popp et al.

(10) Patent No.: US 7,821,791 B2
(45) Date of Patent: Oct. 26, 2010

(54) HOUSING FOR A POWER MODULE

(75) Inventors: Rainer Popp, Petersaurach (DE); Marco Lederer, Nürnberg (DE)

(73) Assignee: SEMIKRON Elektronik GmbH & Co. KG, Nürnberg (DE)

( * ) Notice: Subject to any disclaimer, the term of this patent is extended or adjusted under 35 U.S.C. 154(b) by 445 days.

(21) Appl. No.: 11/983,350

(22) Filed: Nov. 8, 2007

(65) Prior Publication Data

US 2009/0021922 A1  Jan. 22, 2009

(30) Foreign Application Priority Data

Nov. 8, 2006  (DE) .................. 10 2006 052 620

(51) Int. Cl.
*H05K 7/12* (2006.01)
(52) U.S. Cl. .................. 361/728; 361/730; 361/752; 361/715; 174/520; 257/678
(58) Field of Classification Search .............. 361/728, 361/730, 752, 714, 715; 257/678; 174/520
See application file for complete search history.

(56) References Cited

U.S. PATENT DOCUMENTS

| 6,417,747 | B1 | 7/2002 | Dearden et al. | |
|---|---|---|---|---|
| 6,459,582 | B1 * | 10/2002 | Ali et al. | 361/704 |
| 6,507,108 | B1 * | 1/2003 | Lindemann et al. | 257/724 |
| 6,867,972 | B2 * | 3/2005 | Franke | 361/697 |
| 6,979,204 | B2 * | 12/2005 | Gobl et al. | 439/73 |
| 7,187,074 | B2 | 3/2007 | Uchiyama et al. | |
| 7,301,773 | B2 * | 11/2007 | Brewer et al. | 361/719 |
| 7,495,324 | B2 * | 2/2009 | Popp et al. | 257/678 |
| 7,557,442 | B2 * | 7/2009 | Licht | 257/720 |
| 7,589,418 | B2 * | 9/2009 | Lederer et al. | 257/719 |
| 7,592,698 | B2 * | 9/2009 | Lederer et al. | 257/719 |
| 7,683,472 | B2 * | 3/2010 | Popp | 257/690 |
| 2009/0021922 | A1 | 1/2009 | Popp et al. | |

FOREIGN PATENT DOCUMENTS

| DE | 196 30 173 | 1/1998 |
|---|---|---|
| DE | 10 2005 024 900 | 1/2006 |
| DE | 10 2006 052 620 | 5/2008 |
| EP | 1 592 063 | 11/2005 |
| JP | 2005-217075 | 8/2005 |

* cited by examiner

*Primary Examiner*—Dameon E Levi
(74) *Attorney, Agent, or Firm*—Cohen Pontani Lieberman & Pavane LLP

(57) ABSTRACT

A circuit arrangement includes a power module combined with a printed circuit board. The power module and the printed circuit board are disposed between a heat sink and a pressing device and are contact-connected to one another by pressure contact elements. The power module has at least one module board element and a housing formed with shafts for the pressure contact elements. The shafts open out from the housing base facing printed circuit board at opening orifices. The base is formed with orifice sealing ribs around the opening orifices. Moreover, the base of the housing may have a peripheral edge sealing rib along its outer edge. Furthermore, a sealing area element can be provided between the printed circuit board and the base of the housing.

10 Claims, 5 Drawing Sheets

HOUSING FOR A POWER MODULE

BACKGROUND OF THE INVENTION

1. Field of the Invention

The invention is directed to a housing for use as part of a circuit arrangement that includes a power module, and more particularly, to such a housing that provides means for at least partially sealing the housing against the elements.

2. Description of the Related Art

In circuit arrangements of this type, the occurrence of a failure of the circuit arrangement under extreme climate conditions, such as, for example, extreme exposure to moisture with dewing, cannot always be reliably prevented. Such failures are caused in particular by corrosion of a module board element of power module, of the pressure contact elements and/or of the printed circuit board.

There is accordingly a need in the art for circuit arrangements for power modules that are better capable of withstanding the elements.

SUMMARY OF THE INVENTION

It is therefore an object of the invention to provide a circuit arrangement of a power module in which corrosion of the power module, of the pressure contact elements and/or of the printed circuit board is prevented and a resultant failure of the circuit arrangement is avoided using simple and economical means.

In accordance with the invention, the base of the housing is formed with orifice sealing ribs around the opening orifices of shafts provided for the pressure contact elements. The orifice sealing ribs can be assigned to individual opening orifices or to groups of opening orifices.

The provision of orifice sealing ribs affords the benefit that penetration of moisture is prevented and corrosion is thus avoided on the printed circuit board, the pressure contact elements and/or the power module.

The circuit arrangement according to the invention therefore improves the operating reliability and service life of the module.

In a circuit arrangement according to the invention, the orifice sealing ribs can be composed of the same material as the housing, that is to say be formed integrally with the housing in one production process. Alternatively, the orifice sealing ribs may be composed of a compliant material. Such orifice sealing ribs of the latter type can be printed, for example, onto the base of the housing. Another possibility is to produce the housing in a 2C injection method, so that the housing is composed of a dimensionally stable hard material and the orifice sealing ribs are composed of a compliant material and being produced in a common production process at the base of the housing during the realization thereof.

Irrespective of whether the orifice sealing ribs are produced integrally with the housing material or from a relatively compliant material that is different from the housing material, the orifice sealing ribs assigned to the individual opening orifices or groups of opening orifices provide improved sealing between the base of the housing of the power module and the printed circuit board adjacent thereto.

A further improvement in the sealing properties of the circuit arrangement according to the invention results if the base of the housing of the power module has a peripheral edge sealing rib along its outer edge. Said peripheral edge sealing rib—like the orifice sealing ribs—may be composed of the same material as the housing and may therefore be formed integrally with the housing material, or the peripheral edge sealing rib may be of a compliant material and is provided at the outer edge of the base area of the housing of the power module.

The explanations given above with respect to the orifice sealing ribs correspondingly hold true with regard to the peripheral edge sealing rib.

Sealing properties may be improved even further if a sealing area element is provided between the printed circuit board and the base area of the housing, which sealing area element is formed with cutouts for the pressure contact elements. Such a sealing area element is preferably formed by a plastic film. The film can be a PTFE film, for example, which can be used in the temperature range of between −20 and +260° C., is acid-, alkali-, petrol-and oil-resistant and non-flammable and thus meets the fire standard UL94VO.

It goes without saying that the sealing area element may also be composed of some other suitable material.

The sealing area element is expediently formed with external dimensions corresponding to the edge dimensions of the base area of the housing of the power module, that is to say external dimensions which are the same size as or slightly larger than the base of the housing.

Further details, features and advantages emerge from the following description of an exemplary embodiment of the circuit arrangement according to the invention that is illustrated schematically in the drawing, and essential details thereof.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the figures in which like elements are identified with the same reference numerals.

DETAILED DESCRIPTION OF THE PRESENTLY PREFERRED EMBODIMENTS

Figure 1:
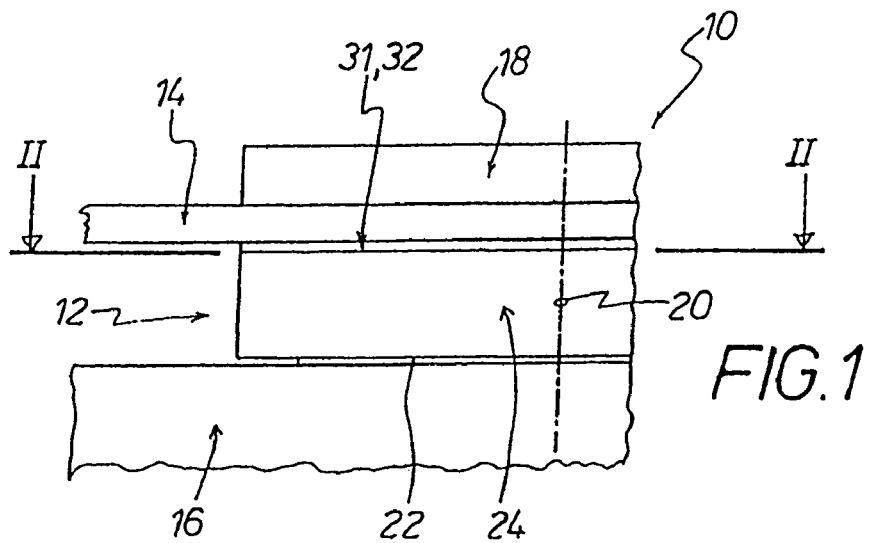
FIG. 1 shows one embodiment of the circuit arrangement in accordance with the invention, shown partially in a side view in a manner not true to scale.
Figure 2:
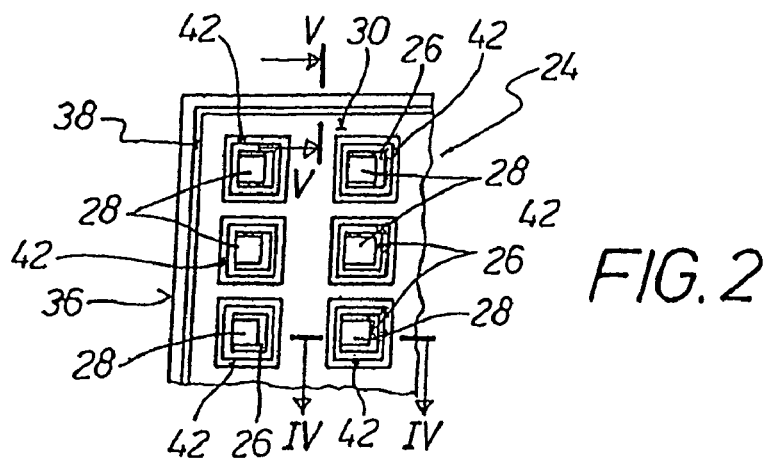
FIG. 2 is a view in the direction of the arrows II-II in FIG. 1 of a portion of the base of the inventive housing.
Figure 3:
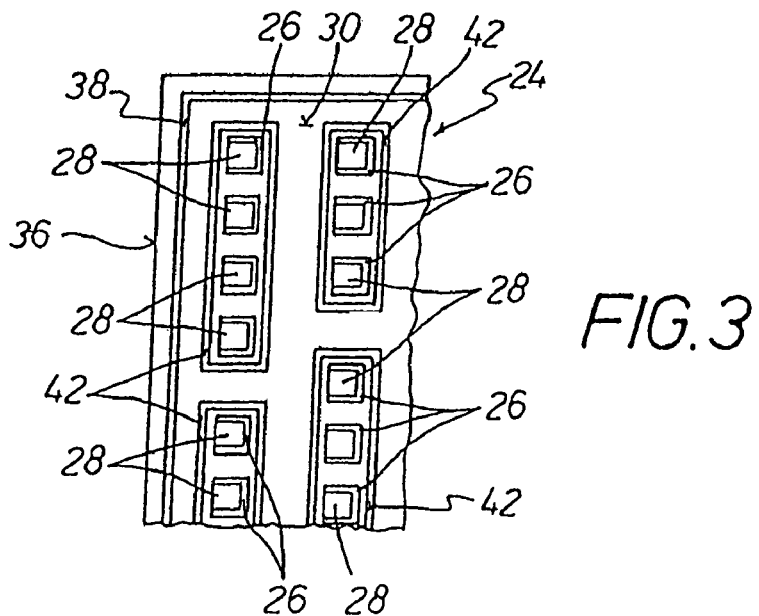
FIG. 3 shows a partial plan view—similar to FIG. 2—of another embodiment of the inventive housing.
Figure 5:
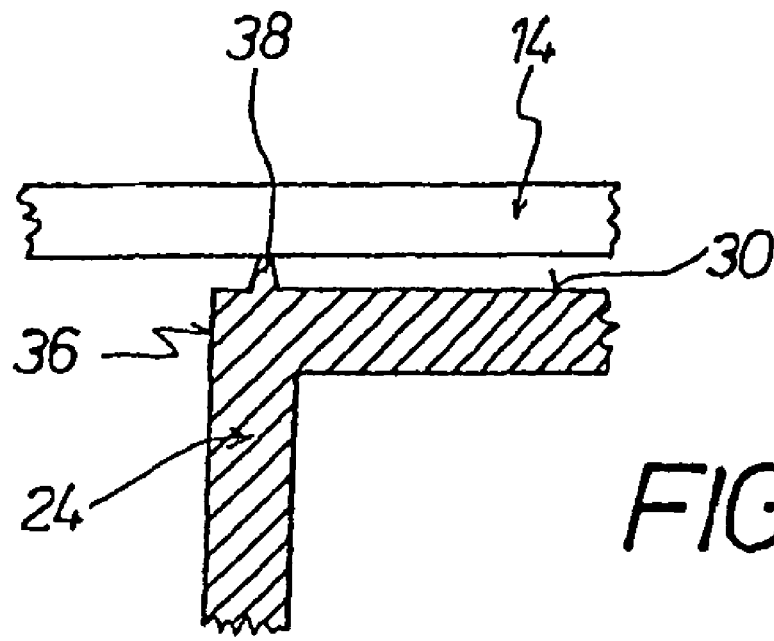
FIG. 5 shows a section along the sectional line V-V in FIG. 2 on a larger scale.
Figure 4:
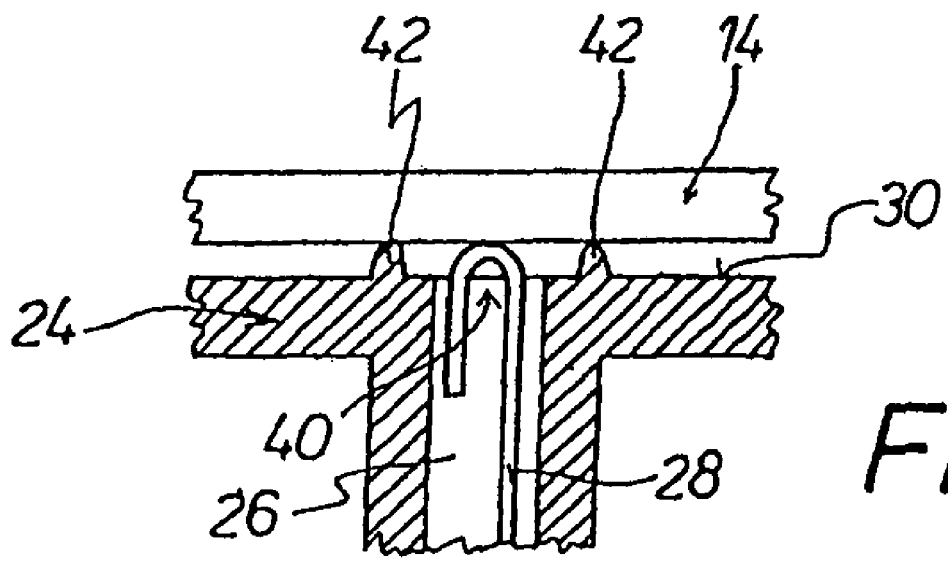
FIG. 4 shows a section along the sectional line IV-IV in FIG. 2 on a larger scale.
Figure 6:
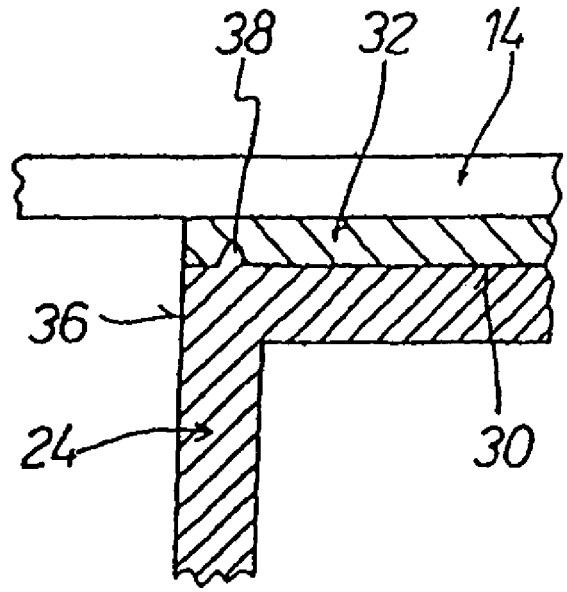
FIG. 6 shows a partial sectional illustration—similar to FIG. 5—of another embodiment of the circuit arrangement.
Figure 7:
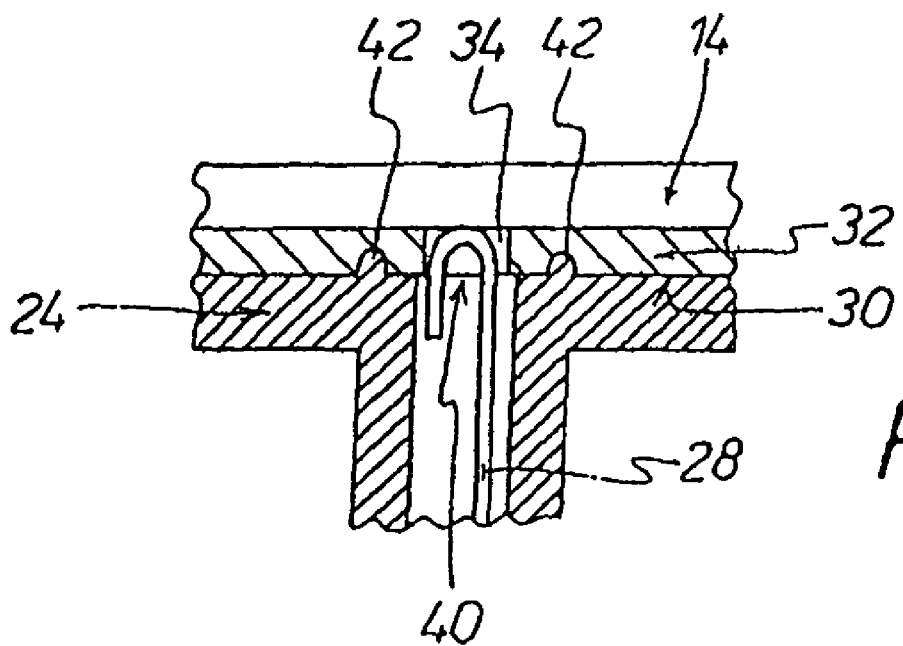
FIG. 7 shows a partial sectional illustration—similar to FIG. 4—of the embodiment of the circuit arrangement in accordance with FIG. 6.
Figure 8:
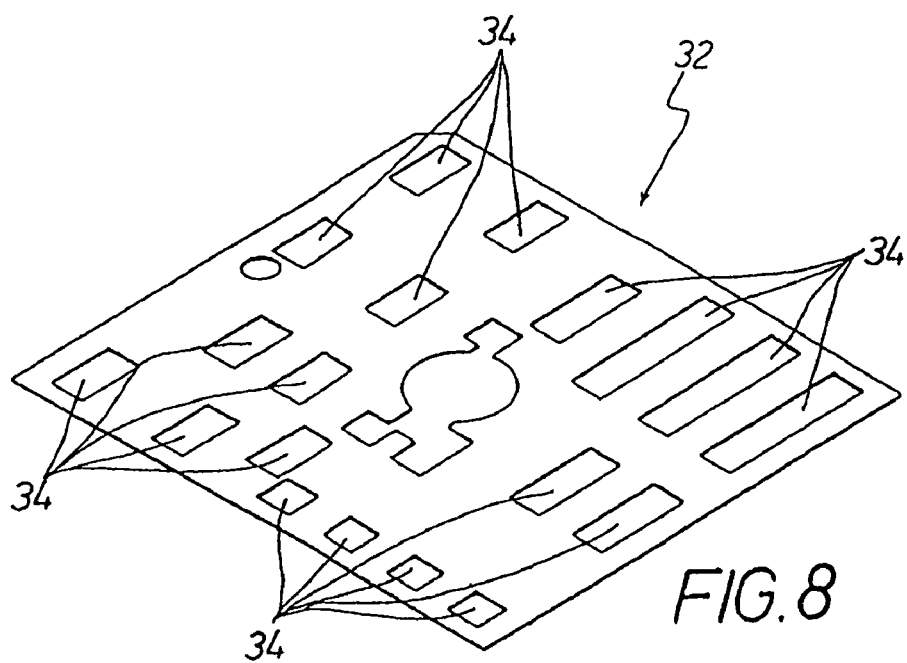
FIG. 8 shows a perspective view of a sealing area element of a circuit arrangement in accordance with FIGS. 6 and 7.
Figure 9:
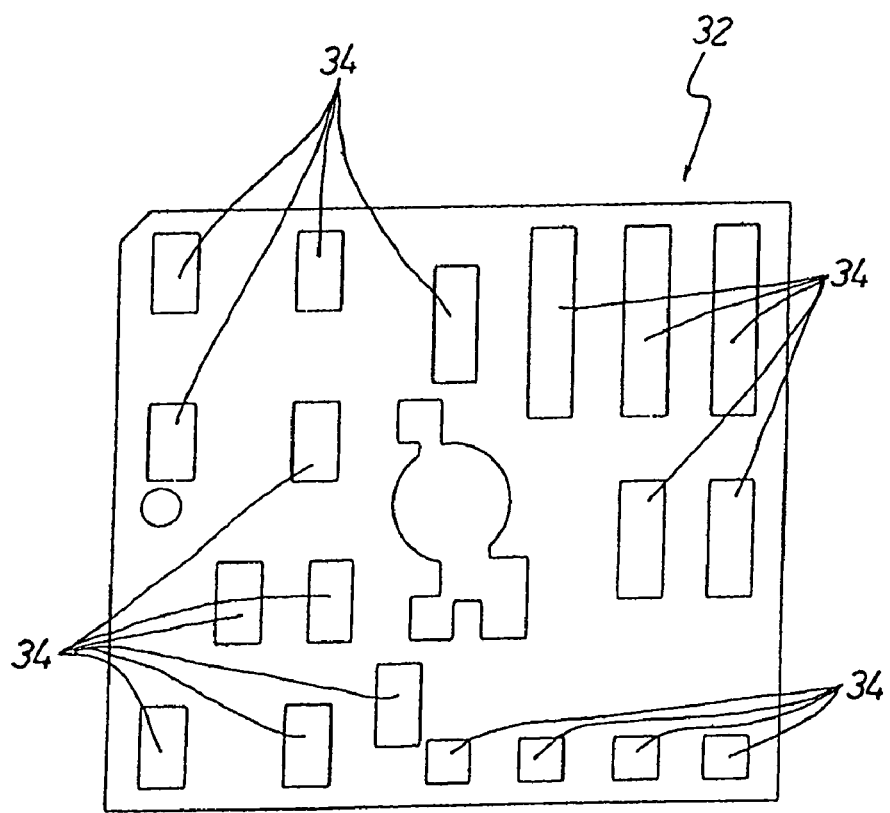
FIG. 9 shows a view of the sealing area element shown from above.
Figure 10:
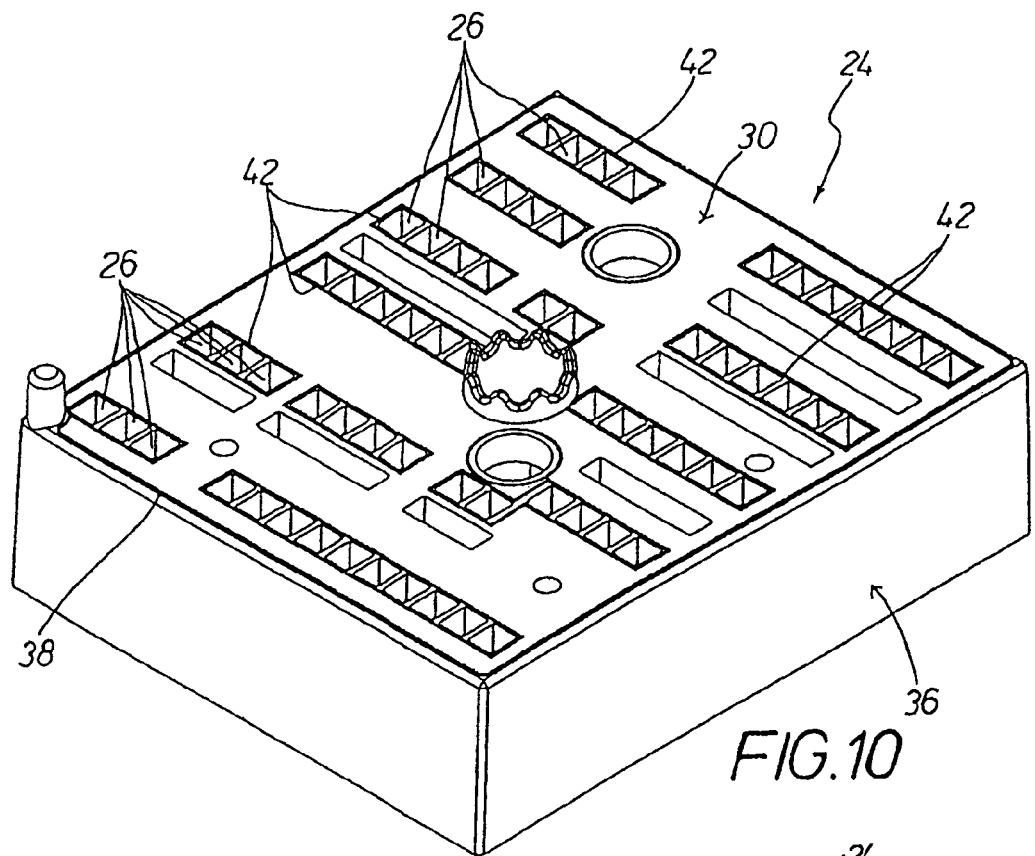
FIG. 10 shows a perspective view of an embodiment of the housing of the power module of the circuit arrangement.
Figure 11:
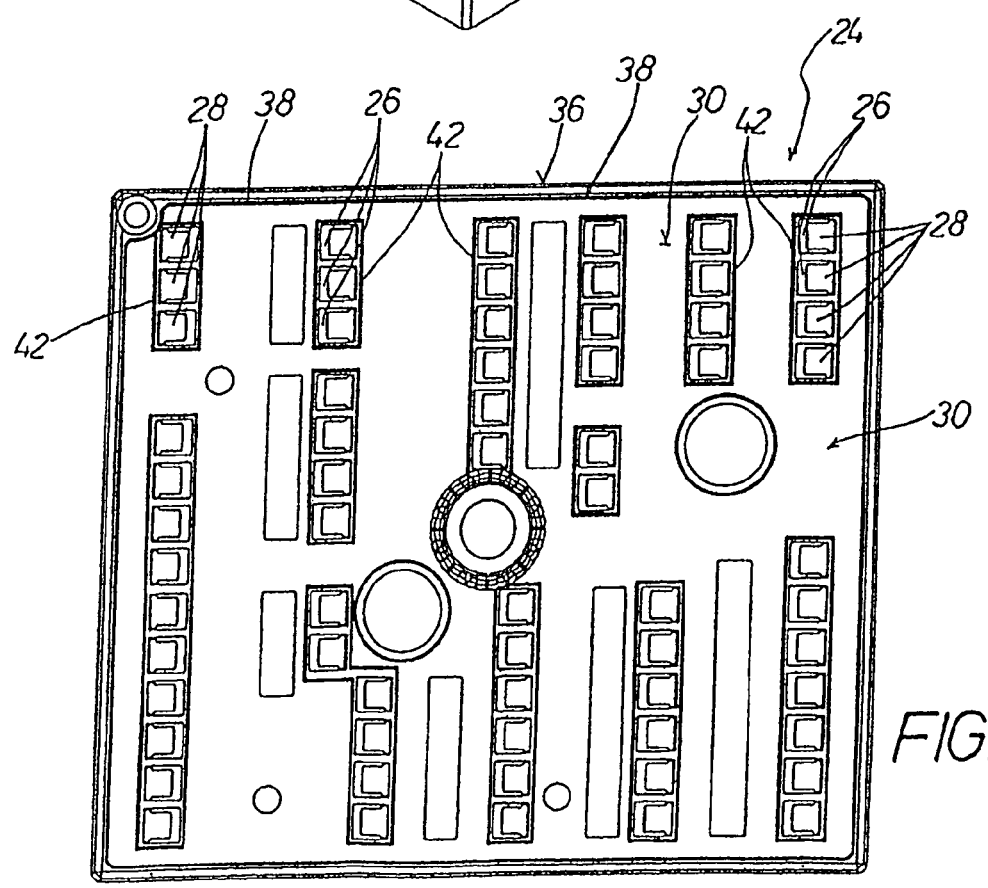
FIG. 11 shows a view of the housing in accordance with FIG. 1 shown from above.

FIG. 1 schematically sectionally illustrates in a side view an embodiment of a circuit arrangement 10 comprising a power module 12 combined with a printed circuit board 14. Power module 12 and printed circuit board 14 are placed between a heat sink 16 and a pressing device 18 and are pressure-contact-connected to one another in a manner known per se.

For pressing the printed circuit board 14 together with the power module 12, pressing device 18 is braced with heat sink 16. This bracing is effected for example with the aid of at least one screw, illustrated schematically by a dash-dotted line 20 in FIG. 1.

Power module 12 has, in a manner known per se, at least one module board element 22 and a cup-shaped housing 24. Housing 24 is formed with shafts 26 (see FIGS. 2, 3, 4, 10 and 11). Shafts 26 are provided for receiving pressure contact elements 28 (see FIGS. 2, 3, 4, 7 and 11). Pressure contact elements 28 serve for the pressure contact-connection—known per se—of module board element 22 to printed circuit board 14.

In order to effect a reliable sealing against the ingress of moisture between power module 12 and printed circuit board 14, a sealing 31 is provided between printed circuit board 14 and the base 30—facing the latter—of housing 24. Sealing 31 is formed by orifice sealing ribs 42 (see FIGS. 2, 3, 4, 7, 10 and 11) which are in each case provided around opening orifices 40 of shafts 26 provided for pressure contact elements 28. In this case, orifice sealing ribs 42 can be assigned in each case to individual shafts 26 (see FIG. 2) or to groups of shafts 26 (see FIG. 3).

In this case, orifice sealing ribs 42 bear directly and immediately closely against printed circuit board 14. Alternatively, a sealing area element 32 is provided between the printed circuit board 14 and base 30 of housing 24 (see FIGS. 6 to 9).

Sealing 31 between printed circuit board 14 and housing 24 of power module 12 can additionally be improved by an edge sealing lip 38 (see FIGS. 2, 3, 5, 6, 10 and 11) running peripherally at an outer edge 36 of base 30.

Sealing area element 32 is preferably formed with cutouts 34 which are configured to receive opening orifices 40 of shafts 26 and through which pressure contact elements 28 extend and are pressure-contact-connected to printed circuit board 14.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A housing for a power module used as part of a circuit arrangement of the power module, a heat sink, a printed circuit board and a pressing device;
   wherein the power module and the printed circuit board are disposed between the heat sink and the pressing device and are pressure-contact-connected to one another by at least one pressure contact element;
   wherein the power module has at least one module board element; and
   wherein the housing comprises:
   a base that faces the printed circuit board; and
   at least one shaft having an opening orifice for receiving a pressure contact element, which pressure contact element is pressure-contact-connected to the at least one module board element and the printed circuit board, said shaft opening out from said base at said opening orifice;
   wherein said base includes at least one orifice sealing rib disposed about said opening orifice.

2. The housing of claim 1, wherein said housing includes at least one opening orifice; and
   wherein said orifice sealing rib is configured to co-operate with at least one pre-determined respective opening orifice.

3. The housing of claim 1, wherein said at least one orifice sealing rib is formed integrally with said housing, and is formed of the same material as said housing.

4. The housing of claim 1 wherein said at least one orifice sealing rib is formed of a compliant material and is disposed at said opening orifice.

5. The housing of claim 1 wherein said base includes a peripheral edge sealing rib along its outer edge.

6. The housing of claim 5, wherein said peripheral edge sealing rib is integrally formed with said housing, and is formed of the same material as said housing.

7. The housing of claim 5, wherein said peripheral edge sealing rib is composed of a compliant material and is provided at said outer edge of said base.

8. The housing of claim 1, further comprising: a sealing area element disposed between said printed circuit board and said base, said sealing area element including cutouts configured to receive said at least one pressure contact element.

9. The housing of claim 8, wherein said sealing area element is configured so that its external dimensions correspond to the edge dimensions of said base.

10. The housing of claim 8, wherein said sealing area element is formed of a plastic film.

* * * * *